US006842344B1

United States Patent
Fix et al.

(10) Patent No.: US 6,842,344 B1
(45) Date of Patent: Jan. 11, 2005

(54) MULTI-LAYER PRINTED CIRCUIT BOARD AND SIGNAL ROUTING THEREIN

(75) Inventors: Robert Fix, Schwenksville, PA (US); Daniel A. Jochym, Downington, PA (US); Christian E. Shenberger, Red Lion, PA (US)

(73) Assignee: Unisys Corporation, Blue Bell, PA (US)

( * ) Notice: Subject to any disclaimer, the term of this patent is extended or adjusted under 35 U.S.C. 154(b) by 9 days.

(21) Appl. No.: 10/390,383

(22) Filed: Mar. 17, 2003

(51) Int. Cl.[7] .............................. H05K 1/00; H05K 1/18; H05K 7/02; H05K 7/06; H05K 7/08
(52) U.S. Cl. ................... 361/748; 361/794; 361/795; 361/750; 361/751; 361/780; 174/255
(58) Field of Search ................. 361/748, 794, 361/795, 750, 751, 780; 174/255

(56) References Cited

U.S. PATENT DOCUMENTS 4,685,033 A * 8/1987 Inoue .......................... 361/794
6,236,572 B1 * 5/2001 Teshome et al. ............ 361/794
6,335,494 B1 * 1/2002 Gregor et al. ............... 174/261
6,621,384 B1 * 9/2003 Handforth et al. .......... 333/238

* cited by examiner

Primary Examiner—David Nelms
Assistant Examiner—Thanh Y. Tran
(74) Attorney, Agent, or Firm—Lise A. Rode; Mark T. Starr; RatnerPrestia P.C.

(57) ABSTRACT

A printed circuit board having a dielectric layer is disclosed. At least one signal trace is disposed adjacent a first surface of the dielectric layer in a first signal area. A reference plane is disposed adjacent a second surface of the dielectric layer in a first reference area positioned opposite the first signal area. The reference plane is configured to carry a reference potential for signals on the signal trace. At least one other signal trace is disposed adjacent the second surface of the dielectric layer in a second signal area and coupled to the signal trace in said first signal area. A second reference plane is disposed adjacent the first surface of the first dielectric layer in a second reference area positioned opposite the second signal area. The second reference plane is configured to carry the reference potential for signals on the other signal trace.

21 Claims, 3 Drawing Sheets

MULTI-LAYER PRINTED CIRCUIT BOARD AND SIGNAL ROUTING THEREIN

FIELD OF THE INVENTION

The present invention relates to the field of printed circuit boards and, more particularly, to multi-layer printed circuit boards having reduced thickness and balanced current return paths.

BACKGROUND OF THE INVENTION

Multi-layer printed circuit boards (PCBs) are commonly used in electronic devices to connect electronic components such as integrated circuits to one another. A typical multi-layer PCB includes many layers of copper, with each layer of copper separated by a dielectric material. Generally, several of the copper layers are used to provide a reference voltage plane or ground plane ("preference planes"). In addition, several layers of the copper are etched to form the lines that connect Individual components (e.g., "traces"). Copper lined through holes (e.g., "vias") extend though the layers of the PCB to selectively connect the electronic components on the surface of the PCB to the reference planes and traces within the PCB and to selectively connect copper is traces on different layers to one another.

To connect two Integrated circuits, which typically require a high number of traces to be run therebetween, traces are run on several different layers of the PCB. A common approach is to run two signal trace layers between a voltage plane and a ground plane. This four-layer pattern is then repeated as needed to route all the traces between the two Integrated circuits. In this approach one of the signal trace layers is farther from the voltage plane than the ground plane and the other signal trace layer is farther from the ground plane than the voltage plane.

Presently, Integrated circuits are being produced that require signal traces to reference simultaneously both a voltage plane and a ground plane of a processor such as a microprocessor. In addition, these Integrated circuits require that the signal traces have an equal current return path through the voltage plane and the ground plane. In the common approach of running two signal trace layers between a ground plane and a voltage plane, the current return path for signal traces on each layer through the voltage plane and the ground plane is unequal do to unequal spacing between these layers.

A contemplated approach to satisfying the equal current return path requirement, while referencing signal traces to both ground and voltage, is to run a voltage plane between two signal trace layers and to run a separate ground plane next to each of the two signal trace layers. This five-layer approach is thought to satisfy the current return requirement; however, an additional routing layer is needed, thereby increasing production costs, which increase as the number of needed layers increase.

Accordingly, a PCB is needed that is able to satisfy recent current return path and voltage/ground reference requirements without the use of additional layers. The present invention fulfils this need among others.

SUMMARY OF THE INVENTION

The present invention includes a printed circuit board having a dielectric layer. At least one signal trace is disposed adjacent a first surface of the dielectric layer in a first signal area. A first reference plane is disposed adjacent a second surface of the dielectric layer in a first reference area positioned opposite the first signal area. The reference plane is configured to carry a reference potential for signals on the signal trace. At least one other signal trace is disposed adjacent the second surface of the dielectric layer in a second signal area and coupled to the signal trace in said first signal area. A second reference plane is disposed adjacent the first surface of the first dielectric layer in a second reference area positioned opposite the second signal area. The second reference plane is configured to carry the reference potential for signals on the other signal trace.

DETAILED DESCRIPTION OF THE INVENTION

Preferred features of selected embodiments of this invention will now be described with reference to the figures. It will be appreciated that the scope of the invention is not limited to the embodiments selected for illustration. Also, it should be noted that the drawings are not rendered to any particular scale or proportion. It is contemplated that any of the configurations and materials described hereafter can be modified within the scope of this invention.

Referring to the figures generally, an exemplary printed circuit board 100 is provided. The exemplary printed circuit board 100 includes a first dielectric layer 130 having a first surface 152 and a second surface 158 opposite the first surface 152. At least one signal trace 126 is disposed adjacent the first surface 152 of the first dielectric layer 130 in a first signal area 150. A first reference plane 134 is disposed adjacent the second surface 158 of the first dielectric layer 130 in a first reference area 160 positioned opposite the first signal area 150. The first reference plane 134 is configured to carry a reference potential for signals on the signal trace 126. At least one other signal trace 132 is disposed adjacent the second surface 158 of the first dielectric layer 130 in a second signal area 156. The signal trace 132 in the second signal area 156 is coupled to the signal trace 126 in the first signal area 150. A second reference plane 128 is disposed adjacent the first surface 152 of the first dielectric layer 130 In a second reference area 154 positioned is opposite the second signal area 156. The second reference plane 128 is configured to carry the reference potential for signals on the other signal trace 132.

A method for routing signal traces and reference planes through a printed circuit board 100 having a reduced thickness and a balanced return path is also provided. The method includes positioning a first reference plane 128 adjacent a first surface 152 of a first dielectric layer 130 opposite at least one trace 132 adjacent a second layer 158 of the first dielectric layer 130. The method also includes positioning a second reference plane 134 adjacent the second surface 158 of the first dielectric layer 130 opposite at least one other trace 126 adjacent the first surface 152 of the first dielectric layer 130 where the at least one other trace 126 is coupled to the at least one trace 132.

Figure 1:
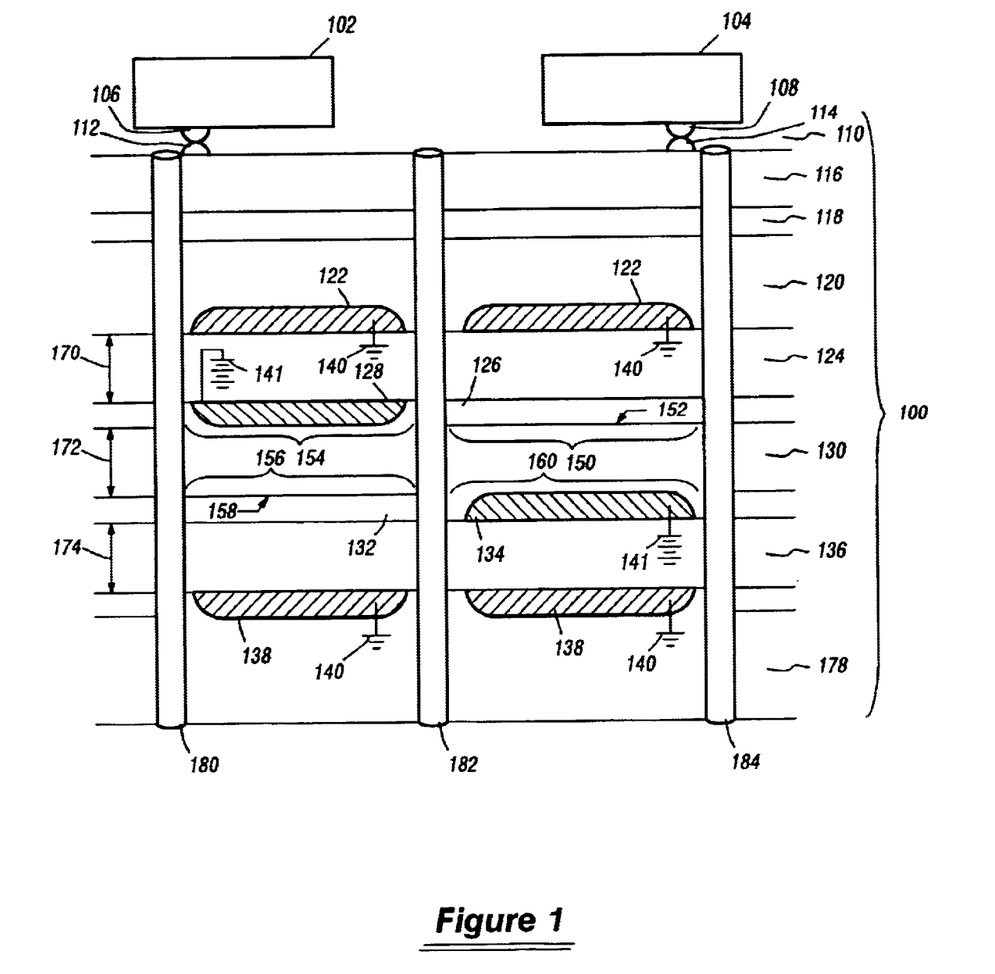
FIG. 1 is a cross-sectional side view of an exemplary embodiment of a portion of a multi-layer PCB In accordance with aspects of the present Invention.

The individual figures are now described in detail. With reference to FIG. 1, a cross-sectional view of a multi-layer PCB assembly 100 in accordance with an exemplary embodiment of the present invention is depicted. In the illustrated embodiment, the PCB. assembly 100 connects a first component 102 to a second component 104. In an exemplary embodiment, the first component 102 and the second component 104 each include a plurality of pins (represented by pin 106 and pin 108, respectively) that are to be connected to pins in the other component. Although only one connection between the components 102, 104 is illustrated in FIG. 1, it will be readily apparent to those of skill in the art that the number of pins and connections may be in the tens, hundreds, or even thousands. The components 102, 104 can be conventional electronic components such as ASICs, processors, connectors, sockets, or other such electronic components.

The illustrated multi-layer PCB assembly 100 includes a pad layer 110 for making electrical connections to the pins of the electrical components 102, 104. In an exemplary embodiment, the pad layer 110 includes a plurality of pads (represented by pad 112 and pad 114 in the illustrated embodiment). In the illustrated embodiment, the first component pin 106 is coupled to pad 112 and the second component pin 108 is coupled to pad 114 to form an electrical connection therebetween. In an exemplary embodiment, the pads 112, 114 are formed and bonded to the pins 106, 108 in a conventional manner.

A group of conventional layers underlie the pad layer 110. These conventional layers include a dielectric layer 116 adjacent and underlying the pad layer 110, a signal trace layer 118 adjacent and underlying the dielectric layer 116, and another dielectric layer 120 adjacent and underlying the dielectric layer 116 and the signal trace layer 118. In an exemplary embodiment, the signal trace layer 118 is an area of etched copper having a plurality of traces for routing signals that aria either low speed or do not have reference voltage requirements and/or current return path requirements A group of layers in accordance with an exemplary embodiment of the present inventions will now, be described. Generally, this group of layers includes a first reference plane 122, a first dielectric layer 124, a first combination layer of a signal buss (e.g., a plurality of signal traces represented by a first signal trace 126) and a second reference plane 128, a second dielectric layer 130, a second combination layer of a signal buss (e.g., a plurality of signal traces represented by a second signal trace 132) and a third reference plane 134, a third dielectric layer 136, and a fourth ground plane 138. In an exemplary embodiment, the signal traces 126, 132 are areas of etched copper for routing signals. Those of skill in the art will recognize that the area of removed copper around the first signal trace 126 will typically be filled with dielectric material from the first dielectric layer 124 and/or the second dielectric layer 130 and that the area of removed copper around the second signal trace 132 will typically be filled with dielectric material from the second dielectric layer 130 and/or the third dielectric layer 136. Thus, in these areas, the dielectric layers are disposed adjacent one another. In an exemplary embodiment, the formation of the individual layers is performed using techniques that will be readily apparent to those of skill in the art of circuit board fabrication and, thus, is not described in detail.

The first and fourth reference planes 122, 138 are coupled to a first reference potential. In the illustrated embodiment, the first reference potential is a. reference ground 140. In an exemplary embodiment, the first and fourth reference planes 122, 138 are planes of a conventional conductor material such as copper coupled to a reference ground such as the ground of a processor (not shown), e.g., a microprocessor, microcontroller, application specific integrated circuit (ASIC), state machine, or essentially any device capable of processing signals. In alternative exemplary embodiments, the first reference potential is a positive reference voltage or a negative reference voltage.

The first dielectric layer 124 is disposed between the first reference layer 122, and the second dielectric layer 130 and the first combination layer of the first signal trace 126 and the second reference plane 128. The first dielectric layer 124 electrically separates the first reference plane 122 from the first combination layer of the first signal trace 126 and the second reference plane 128. The third dielectric layer 136 is disposed between the fourth reference layer 138, and the second dielectric layer 130 and the second combination layer of the second signal trace 132 and the third reference plane 134. The third dielectric layer 130 electrically separates the fourth reference plane 138 from the first combination layer of the second signal trace 132 and the third reference plane 134.

The first signal trace 126 is disposed adjacent the second dielectric layer 130 in a first signal area 150 on a top surface 152 of the second dielectric layer 130. The second reference plane 128 is also disposed adjacent the second dielectric layer in a reference area 154 on the top surface 152 of the second dielectric layer 130. The second reference plane 128 is coupled to a second reference potential. In the illustrated embodiment, the second reference potential is a positive reference voltage 141 such as a reference voltage of a processor (not shown), e.g., a microprocessor, microcontroller, application specific integrated circuit (ASIC), state machine, or essentially any device capable of processing signals. In alternative exemplary embodiments, the second reference potential is a reference ground or a negative reference voltage. In certain exemplary embodiments, the first and second reference potentials are equal. In certain other exemplary embodiments, one of the reference potentials is more positive or negative than the other.

The second signal trace 132 is disposed adjacent the second dielectric layer 130 in a second signal area 156 on a bottom surface 158 of the second dielectric layer 130. The third reference plane 134 is also disposed adjacent the second dielectric layer in a reference area 160 on the bottom surface 158 of the second dielectric layer 130. The reference plane 134 is coupled to a reference potential, e.g., reference voltage 141, such as the reference potential described above with reference to the second reference plane 128.

The second reference plane 128 is positioned opposite the second signal trace 132 and the third reference plane 134 is positioned opposite the first signal trace 126. In an exemplary embodiment, the second reference plane 128 is configured to carry a reference potential for signals on the second signal trace 132 and the third reference plane 134 is configured to carry the reference potential for signals on the first signal trace 126.

Figure 2A:
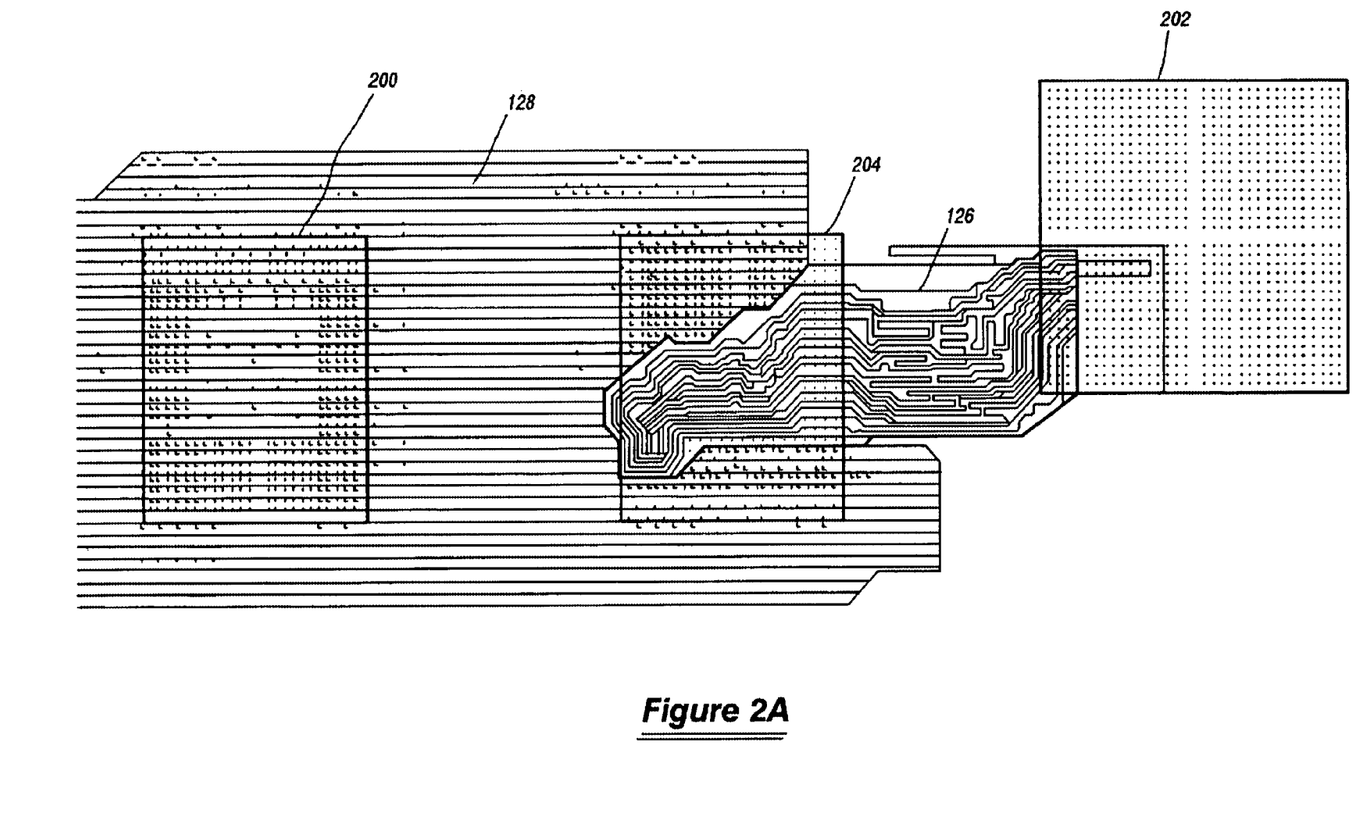
FIG. 2A is a top view of signal traces and voltage fill adjacent one surface of a dielectric layer of the multi-layer PCB of FIG. 1.
Figure 2B:
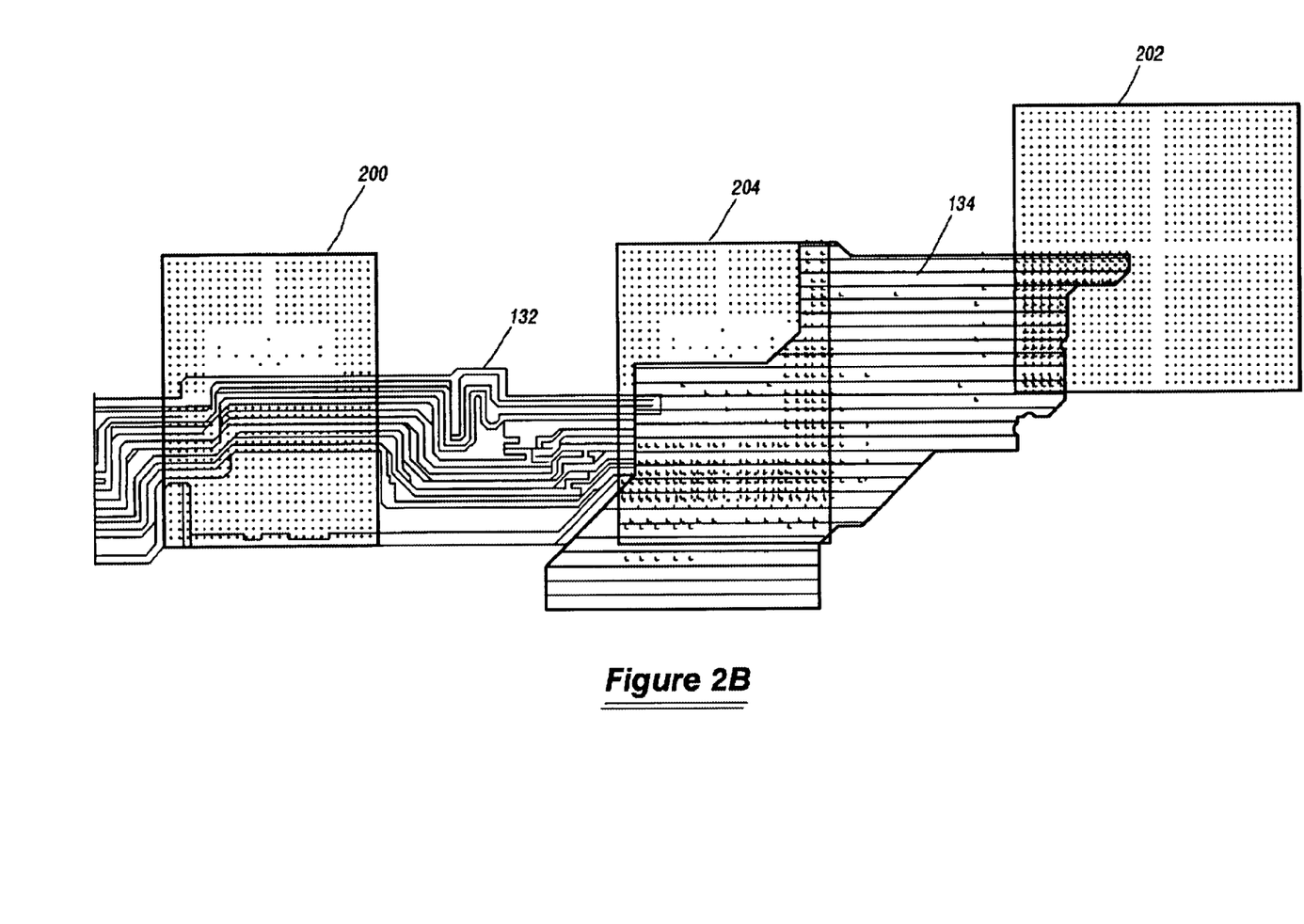
FIG. 2B is a top view of signal traces and voltage fill adjacent another. surface of the dielectric layer of FIG. 2A.

FIG. 2A depicts a top view of the first combination layer including the first signal trace 126 and the second reference plane 128, and FIG. 2B depicts a top view of the second combination layer including the second signal trace 132 and the third reference plane 134. A first pin field 200 corresponding to a first component (e.g., the first component 102 of FIG. 1), a second pin field 202 corresponding to a second component, and a third pin field 204 corresponding to a third component (e.g., the second component 104 of FIG. 2)

provide a point of reference between FIGS. 2A and 2B. As depicted in FIGS. 2A and 2B, the first reference area 128 (FIG. 2A) corresponds to an area including the second signal trace 132 (FIG. 2B) and the second reference area 134 (FIG. 2B) corresponds to an area including the first signal trace 126 (FIG. 2A). In the Illustrated embodiment, switching of the first and second combination layers from signal trace to reference plane, and vice versa, occurs in the pin field 204 of the second component.

Referring back to FIG. 1, the first signal trace 126 is separated from the first reference plane 122 by a first distance 170, the first signal trace 126 is separated from the third reference plane 134 by a second distance 172, the second signal trace 132 is separated from the fourth reference plane 138 by a third distance 174, and the second signal trace 132 is separated from the second reference plane 128 by the second distance 172. In an exemplary embodiment, the first, second, and third distances are substantially equal. Thus, the structures are equivalent. Making the distances equal results in equal current return paths. Passing a signal down the first signal trace 126 induces a return current on the first reference plane 122. Because of the equivalent physical structure, an identical return current is induced on the third reference plane 134. Likewise, passing a signal down the second signal trace 132 induces a return current on the fourth plane 138 and an identical return current on the second reference plane 128. Thus, this four-layer approach (e.g., ground-first combination signal/voltage-second combination signal/voltage-ground) is able to provide both reference ground and reference voltage for each signal and equal current return.

One or more additional layers (represented by layer 178) may be disposed on the fourth reference plane 138 based on desired design parameters. These layers may include conventional layers or additional layers in accordance with the exemplary embodiment described above with reference to layers 124–138. One exemplary embodiment of the layers of an entire PCB In accordance with the present invention is described in detail below with reference to Table 1.

A plurality of vias interconnect the layers of the PCB (represented by a first via 180, a second via 182, and a third via 184). In an exemplary embodiment, each via is a "standard" via that extends through each layer of the PCB 100. In certain exemplary embodiments, blind/buried vias, and/or micro vias may be used.

An exemplary use is now described with reference to a signal passing between the first component 102 and the second component 104. A signal originating from the first component 102 passes through pin 106 to pad 112. The signal then enters via 180, which is coupled to pad 112. Next, the signal is passed through the via 180 to the second signal trace 132. While passing through the second signal trace 132, the signal. is referenced to the fourth reference plane 138 and the second reference plane 128. The second via 182 passes the signal from the second signal trace 132 to the first signal trace 126. While passing through the first signal trace 126, the signal is referenced to the first reference plane 122 and the third reference plane 134. The signal from the first signal trace 126 is passed through the third via 184, which is coupled to the second pad 114. The signal then passes through the pin 108 to component 104.

Table 1 illustrates the layers of a multi-layer PCB that incorporates layers in accordance with and exemplary embodiment of the present inventions.

TABLE 1

| Layer # | Layer Type | Thickness | Layer Name | Line Width | Impedance | |
|---|---|---|---|---|---|---|
| | | | TOP PASTE | | | |
| | | | TOP SILK | | | |
| | | | TOP MASK | | | |
| | | | TOP PAD | | | |
| 1 | Copper | 0.0021 | | | | |
| | Prepreg | 0.0020 | | | | |
| 2 | Copper | 0.0014 | SIG1 | 0.0045 | 50 | |
| | Core | 0.0030 | | | | |
| 3 | Copper | 0.0014 | GND | | | |
| | Prepreg | 0.0055 | | | | |
| 4 | Copper | 0.0014 | MIX1 | " | 50 | VProcFill/SB |
| | Core | 0.0055 | | | | |
| 5 | Copper | 0.0014 | MIX2 | " | 50 | VProcFill/SB |
| | Prepreg | 0.0055 | | | | |
| 6 | Copper | 0.0014 | GND | | | |
| | Core | 0.0055 | | | | |
| 7 | Copper | 0.0014 | MIX3 | " | 50 | VProcFill/SB |
| | Prepreg | 0.0055 | | | | |
| 8 | Copper | 0.0014 | MIX4 | " | 50 | VProcFill/SB |
| | Core | 0.0055 | | | | |
| 9 | Copper | 0.0014 | GND | | | |
| | Prepreg | 0.0055 | | | | |
| 10 | Copper | 0.0014 | MIX5 | " | 50 | VProcFill/SB |
| | Core | 0.0055 | | | | |
| 11 | Copper | 0.0014 | MIX6 | " | 50 | VProcFill/SB |
| | Prepreg | 0.0055 | | | | |
| 12 | Copper | 0.0014 | GND | | | |
| | Core | 0.0055 | | | | |
| 13 | Copper | 0.0014 | MIX7 | " | 50 | VProcFill/SB |
| | Prepreg | 0.0055 | | | | |
| 14 | Copper | 0.0014 | MIX8 | " | 50 | VProcFill/SB |
| | Core | 0.0055 | | | | |
| 15 | Copper | 0.0014 | GND | | | |
| | Prepreg | 0.0055 | | | | |

TABLE 1-continued

| Layer # | Layer Type | Thickness | Layer Name | Line Width | Impedance | |
|---|---|---|---|---|---|---|
| 16 | Copper | 0.0014 | MIX9 | " | 50 | VProcFill/SB |
| | Core | 0.0055 | | | | |
| 17 | Copper | 0.0014 | MIX10 | " | 50 | VProcFill/SB |
| | Prepreg | 0.0055 | | | | |
| 18 | Copper | 0.0014 | GND | | | |
| | Core | 0.0030 | | | | |
| 19 | Copper | 0.0014 | SIG2 | 0.0045 | 50 | |
| | Prepreg | 0.0020 | | | | |
| 20 | Copper | 0.0021 | | | | |
| | | | BOTTOM PAD | | | |
| | | | BOTTOM MASK | | | |
| | | | BOTTOM SILK | | | |
| | | | BOTTOM PASTE | | | |
| | Total | 0.1219 | | "0.0075/−0.0100" | | |

The layers of the, PCB as set forth in Table 1 include 20 copper layers (numbered 1–20). Each of the copper layers are separated by either a core type material or a prepreg type material. The separation of the copper layers by core type material and prepreg reflects the type of processing used to create the PCB. Typically a core includes a layer of hardened dielectric material having copper on both sides. The copper on each side of the core is then etched to create the appropriate copper pattern (e.g., traces or voltage/ground reference planes). Layers of prepreg, which are similar to the dielectric material within the core prior to hardening, is then inserted between the core layers having etched copper.

When all the layers are assembled, the assembly is compressed and the prepreg fills the gaps in the copper and provides a layer of dielectric between the copper and the next layer. The prepreg is then hardened. In an exemplary embodiment, the prepreg layers are typically a minimum of 2.0 or 5.5 mils and extend to 3.4 or 6.9 mils, respectively, in areas where it enters the gaps in the copper.

The first and twentieth copper layers are copper pads on the top and bottom of the PCB for connecting to electrical components. Each of the first and twentieth copper layers care 2.1 mils thick and separated from the next copper layer by a 2.0 mil layer of prepreg.

The second and nineteenth copper layers are signal trace layers having traces that are 4.5 mils wide with impedance of 50 Ohms. These layers are not encased within dual reference layers. Accordingly, these layers are typically used for slower speed traces.

The third, sixth, ninth, twelfth, fifteenth, and eighteenth copper layers are ground planes in accordance with the present invention. In an exemplary embodiment, these layers are 1.4 mils thick.

The fourth, fifth, seventh, eighth, tenth, eleventh, thirteenth, fourteenth, sixteenth, and seventeenth layers are combined layers of signal buss (SB) traces and reference voltage planes (VProcFill). In an exemplary embodiment, these layers are 1.4 mils thick, have a width of 4.5 mils, and impedance of 50 Ohm.

The following layer structures are in accordance with an exemplary embodiment of the present inventions: layers 3–6, 6–9, 9–12,12–15, 15–18. For example, layer 3 corresponds to the first reference plane 122 (FIG. 1), layer 4 corresponds to the first combination layer including the first signal trace 126 and the second reference plane 128, layer 5 corresponds to the second combination layer Including the second signal trace 132 and the third reference plane 134, and layer 6 corresponds to the fourth reference plane 138. In certain exemplary embodiments, more or less such structured layers may is be used.

In the multi-layer PCB of table 1 a top solder paste, a top silk screen, a top solder mask, a bottom solder mask, a bottom silk screen, and a bottom solder paste are conventional layers deposited on the multi-layer circuit board In a well known manner.

The total thickness of the exemplary PCB is 1219 mils (+7.5 mils/−10.0 mils). In an exemplary embodiment, trace widths in areas corresponding to reference voltage fill are 4.5 mils and other traces are 5.0 mils. This arrangement provides an impedance of approximately 50 Ohms for each trace.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A printed circuit board comprising:

a first dielectric layer having a first surface and a second surface opposite said first surface;

at least one signal trace disposed adjacent said first surface of said first dielectric layer in a first signal area;

a first reference plane disposed adjacent said second surface of said first dielectric layer in a first reference area positioned opposite said first signal area, said first reference plane configured to carry a first reference potential for signals on said signal trace;

at least one other signal trace disposed adjacent said second surface of said first dielectric layer in a second signal area, said signal trace in said second signal area being coupled to said signal trace in said first signal area;

a second reference plane disposed adjacent said first surface of said first dielectric layer in a second reference area positioned opposite said second signal area, said second reference plane configured to carry said first reference potential for signals on said other signal trace;

a second dielectric layer having a surface disposed adjacent said first surface of said first dielectric layer, said signal trace in said first signal area, and said second reference plane; and a third reference plane disposed adjacent an opposite surface of said second dielectric layer, said third reference plane configured to receive a second reference potential for signals on said signal trace in said first signal area, said first and second reference potentials being different.

2. The printed circuit board of claim 1, further comprising:
at least one via extending through said first dielectric layer, said at least one via coupling said signal trace in said first signal area to said signal trace in said second signal area.

3. The printed circuit board of claim 1, further comprising:
a third dielectric layer having a surface disposed adjacent said second surface of said first dielectric layer, said trace in said second signal area, and said first reference plane; and
a fourth reference plane disposed on an opposite surface of said third dielectric layer, said fourth reference plane configured to receive said second reference potential for signals on said signal trace in said second signal area.

4. The printed circuit board of claim 3, wherein a signal passing through said trace in said first signal area is referenced to said first reference potential on said first reference plane and to said second reference potential on said third reference plane; and
wherein when said signal passes to said trace in said second signal area, said signal is referenced to said first reference potential on said second reference plane and to said second reference potential on said fourth reference plane.

5. The printed circuit board of claim 4, wherein said trace in said first signal area and said second reference plane adjacent said first surface of said first dielectric layer are spaced from said trace in said second signal area and said first reference plane adjacent said second surface of said first dielectric layer by a predefined distance;
wherein said third reference plane is spaced from said trace in said first signal area and said second reference plane by said predefined distance; and
wherein said fourth reference plane is spaced from said trace in said second signal area and said first reference plane by said predefined distance.

6. The printed circuit board of claim 1, wherein said at least one trace and said second reference plane adjacent said first surface of said first dielectric layer are spaced from said at least one other trace and said second reference plane adjacent said second surface of said first dielectric layer by a predefined distance.

7. A printed circuit board comprising:
a first dielectric layer having a first surface and a second surface opposite said first surface;
at least one signal trace disposed adjacent said first surface of said first dielectric layer in a first signal area;
a first reference plane disposed adjacent said second surface of said first dielectric layer in a first reference area positioned opposite said first signal area, said first reference plane configured to carry a first reference potential for signals on said signal trace;
at least one other signal trace disposed adjacent said second surface of said first dielectric layer in a second signal area, said signal trace in said second signal area being coupled to said signal trace in said first signal area; and
a second reference plane disposed adjacent said first surface of said first dielectric layer in a second reference area positioned opposite said second signal area, said second reference plane configured to carry said first reference potential for signals on said other signal trace;
another dielectric layer having a surface disposed adjacent said first reference plane;
at least one other dielectric layer having a first surface and a second surface opposite said first surface, said at least one other dielectric layer disposed adjacent an opposite surface of said another dielectric layer;
at least one signal trace disposed adjacent said first surface of said at least one other dielectric layer in a third signal area;
a reference plane disposed adjacent said second surface of said at least one other dielectric layer in a first reference area positioned opposite said third signal area, said reference plane configured to carry a first reference potential for signals on said signal trace;
at least one other signal trace disposed adjacent said second surface of said at least one other dielectric layer in a fourth signal area, said signal trace in said fourth signal area being coupled to said signal trace in said third signal area; and
another reference plane disposed adjacent said first surface of said at least one other dielectric layer in a second reference area positioned opposite said fourth signal area, said another reference plane configured to carry said first reference potential for signals on said other signal trace.

8. The printed circuit board of claim 7, wherein the another dielectric layer and the at least one other dielectric layer having reference planes and signal traces disposed adjacent thereto are repeated at least one time.

9. A printed circuit board comprising:
a first dielectric layer having a first surface and a second surface opposite said first surface;
at least one signal trace disposed adjacent said first surface of said first dielectric layer in a first signal area;
a first reference plane disposed adjacent said second surface of said first dielectric layer in a first reference area positioned opposite said first signal area, said first reference plane configured to carry a first reference potential for signals on said at least one signal trace;
at least one other signal trace disposed adjacent said second surface of said first dielectric layer in a second signal area, said signal trace in said second signal area being coupled to said signal trace in said first signal area;
a second reference plane disposed adjacent said first surface of said first dielectric layer in a second reference area positioned opposite said second signal area, said second reference plane configured to carry said first reference potential for signals on said at least one other signal trace;
at least one via extending through said first dielectric layer, said at least one via coupling said signal trace in said first signal area to said signal trace in said second signal area;
a second dielectric layer having a surface disposed adjacent said first surface of said first dielectric layer, said at least one signal traces, and said second reference plane;
a third reference plane disposed adjacent an opposite surface of said second dielectric layer, said third reference plane configured to receive a second reference potential for signals on said at least one signal trace;

a third dielectric layer having a surface disposed adjacent said second surface of said first dielectric layer, said at least one other signal traces, and said first reference plane; and a fourth reference plane disposed on an opposite surface of said third dielectric layer, said fourth reference plane configured to receive said second reference potential for signals on said at least one other trace.

10. The printed circuit board of claim 9, wherein a signal passing through said trace in said first signal area is referenced to said first reference potential on said first reference plane and to said second reference potential on said third reference plane; and wherein when said signal passes to said trace in said second signal area, said signal is referenced to said first reference potential on said second reference plane and to said second reference potential on said fourth reference plane.

11. The printed circuit board of claim 10, wherein said at least one signal trace and said second reference plane adjacent said first surface of said first dielectric layer are spaced from said at least one other signal trace and said first reference plane adjacent said second surface of said first dielectric layer by a predefined distance;

wherein said third reference plane is spaced from said at least one trace and said second reference plane by said predefined distance; and wherein said fourth reference plane is spaced from said at least one other signal trace and said first reference plane by said predefined distance.

12. The printed circuit board of claim 9, wherein said at least one trace and said second reference plane adjacent said first surface of said first dielectric layer are spaced from said at least one other trace and said second reference plane adjacent said second surface of said first dielectric layer by a predefined distance.

13. The printed circuit board of claim 9, wherein said first and second reference potentials are different.

14. A method for routing signal traces and reference planes through a printed circuit board having a reduced thickness and a balanced return path said method comprising the steps of:

positioning a first reference plane configured to receive a first reference potential adjacent a first surface of a first dielectric layer opposite at least one trace adjacent a second surface of said first dielectric layer;

positioning a second reference plane configured to receive said first reference potential adjacent said second surface of said first dielectric layer opposite at least one other trace adjacent said first surface of said first dielectric layer said at least one other trace coupled to said at least one trace;

positioning a third reference plane configured to receive a second reference potential adjacent a surface of a second dielectric layer, another surface of said second dielectric layer adjacent said first reference plane, said at least one other trace, and said first surface of said first dielectric layer, said first and second reference potentials being different.

15. The method of claim 14, further comprising the step of:

forming a via through said dielectric layer, said via coupling said at least one trace and said at least one other trace.

16. The method of claim 14, further comprising the step of:

positioning a fourth reference plane configured to receive said second reference potential adjacent a surface of a third dielectric layer, another surface of said third dielectric layer adjacent said second reference plane, said at least one trace, and said second surface of said first dielectric layer.

17. The method of claim 16, further comprising the steps of:

repeating the steps of:

positioning a first reference plane adjacent a first surface of a first dielectric layer opposite at least one trace adjacent a second layer of said first dielectric layer;

positioning a second reference plane adjacent said second surface of said first dielectric layer opposite at least one other trace adjacent said second layer of said first dielectric layer, said at least one other trace coupled to said at least one trace;

positioning a fourth reference plane adjacent a surface of a third dielectric layer, another surface of said third dielectric layer adjacent said second reference plane, said at least one trace, and said second surface of said first dielectric layer; and positioning a fourth dielectric layer between the fourth reference plane and the first surface of the first dielectric layer including the first reference plane and at least one trace to form additional layers of the printed circuit board.

18. A printed circuit board comprising:

a first dielectric layer having opposed surfaces;

a signal area with at least one signal trace disposed adjacent each of said opposed surfaces of said first dielectric layer;

a reference area with a reference voltage plane disposed adjacent each opposed surface of said first dielectric layer, said reference area configured to receive a first potential;

a pair of dielectric layers separated by said first dielectric layer, said signal areas, and said reference areas, each of said pair of dielectric layers having another reference area with a reference plane disposed adjacent each surface of the pair of dielectric layers facing away from the first dielectric layer, said another reference area configured to receive a second potential;

each said signal area corresponding in location to said reference area on an opposite surface of said first dielectric layer and one of said another reference areas of said pair of dielectric layers, each said reference area corresponding in location to said signal area on an opposite surface of said first dielectric layer, and each said another reference area corresponding in location to said signal area on a surface of said first dielectric layer facing said another reference area;

said signal traces of said signal areas on said opposed surfaces of said dielectric layer being electrically coupled to one another, said reference planes of said reference areas on said opposed surfaces of said dielectric layer being electrically coupled to one another, and said another reference planes of said another reference areas on said pair of dielectric layers being electrically coupled to one another;

wherein said reference planes provide a first reference potential for said traces and said another reference planes provide a second reference potential for said traces.

19. The printed circuit board of claim 18, wherein the first and second reference potentials are different.

20. A method for routing signal traces and reference planes through a printed circuit board, said method comprising the steps of:

- locating at least one signal trace in a signal area adjacent each opposed surface of a first dielectric layer;
- locating a reference plane in a reference area adjacent each of the opposed surfaces of the first dielectric layer;
- locating a pair of dielectric layers such that the pair of dielectric layers are separated by said first dielectric layer, said signal areas, and said reference areas, each of said pair of dielectric layers having another reference area with a reference plane disposed adjacent each surface of the pair of dielectric layers facing away from the first dielectric layer;
- positioning each said signal area to correspond to said reference area on an opposite surface of the first dielectric layer and one of said another reference areas, positioning each said reference area to correspond to the signal area on an opposite surface of the first dielectric layer, and positioning each said another reference area to correspond to the signal area on a surface of the first dielectric layer facing said another reference area; and
- coupling the signal traces of the signal areas on the opposed surfaces of the first dielectric layer to one another, coupling the reference planes of the reference areas on the opposed surfaces of the first dielectric layer to one another, thereby providing a first reference potential for the traces, and coupling the reference planes of the another reference area on the pair of dielectric layers to one another, thereby providing a second reference potential for the traces.

21. The method of claim 20, further comprising the step of:

- applying the first reference potential to the reference planes of the reference areas on the opposed surfaces of the first dielectric layer; and
- applying the second reference potential to the reference planes of the another reference area on the pair of dielectric layer; wherein the first and second reference potentials are different.

* * * * *